(12) United States Patent
Yokoi et al.

(10) Patent No.: US 11,707,804 B2
(45) Date of Patent: Jul. 25, 2023

(54) MASK-INTEGRATED SURFACE PROTECTIVE TAPE

(71) Applicant: FURUKAWA ELECTRIC CO., LTD., Tokyo (JP)

(72) Inventors: Hirotoki Yokoi, Tokyo (JP); Tomoaki Uchiyama, Tokyo (JP); Yoshifumi Oka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 336 days.

(21) Appl. No.: 15/868,056

(22) Filed: Jan. 11, 2018

(65) Prior Publication Data

US 2018/0226359 A1 Aug. 9, 2018

Related U.S. Application Data

(63) Continuation of application No. PCT/JP2016/082985, filed on Nov. 7, 2016.

(30) Foreign Application Priority Data

Nov. 9, 2015 (JP) .................................. 2015-219737

(51) Int. Cl.
| | | |
|---|---|---|
| *H01L 23/00* | (2006.01) | |
| *B23K 26/38* | (2014.01) | |
| *B23K 26/402* | (2014.01) | |
| *C09J 7/38* | (2018.01) | |
| *C09J 7/40* | (2018.01) | |
| *C09J 133/06* | (2006.01) | |
| *C08F 220/18* | (2006.01) | |
| *H01L 21/304* | (2006.01) | |
| *C09J 7/24* | (2018.01) | |
| *C09J 7/35* | (2018.01) | |
| *C09J 133/08* | (2006.01) | |
| *H01L 21/02* | (2006.01) | |
| *H01L 21/3065* | (2006.01) | |
| *H01L 21/683* | (2006.01) | |
| *H01L 21/78* | (2006.01) | |
| *B23K 103/16* | (2006.01) | |
| *B23K 101/40* | (2006.01) | |

(52) U.S. Cl.
CPC ............ *B23K 26/38* (2013.01); *B23K 26/402* (2013.01); *C08F 220/1804* (2020.02); *C08F 220/1808* (2020.02); *C08F 220/1812* (2020.02); *C09J 7/243* (2018.01); *C09J 7/35* (2018.01); *C09J 7/38* (2018.01); *C09J 7/40* (2018.01); *C09J 7/401* (2018.01); *C09J 133/066* (2013.01); *C09J 133/08* (2013.01); *H01L 21/02076* (2013.01); *H01L 21/304* (2013.01); *H01L 21/3065* (2013.01); *H01L 21/6836* (2013.01); *H01L 21/78* (2013.01); *H01L 23/562* (2013.01); *B23K 2101/40* (2018.08); *B23K 2103/172* (2018.08); *C09J 2203/326* (2013.01); *C09J 2423/006* (2013.01); *C09J 2427/005* (2013.01); *C09J 2433/00* (2013.01); *H01L 2221/6834* (2013.01); *H01L 2221/68327* (2013.01); *H01L 2221/68381* (2013.01)

(58) Field of Classification Search
CPC ............ H01L 23/562; C09J 7/243; C09J 7/40
See application file for complete search history.

(56) References Cited

U.S. PATENT DOCUMENTS

| | | | |
|---|---|---|---|
| 8,999,816 B1* | 4/2015 | Holden | H01L 21/78 |
| | | | 438/113 |
| 2004/0238486 A1 | 12/2004 | Tanaka | |
| 2007/0141330 A1 | 6/2007 | Morishima et al. | |
| 2009/0004780 A1 | 1/2009 | Arita et al. | |
| 2010/0022071 A1 | 1/2010 | Arita et al. | |
| 2010/0173474 A1 | 7/2010 | Arita et al. | |
| 2011/0014777 A1 | 1/2011 | Haji et al. | |
| 2012/0322237 A1 | 12/2012 | Lei et al. | |
| 2014/0170535 A1* | 6/2014 | Yano | G03F 1/64 |
| | | | 430/5 |
| 2015/0104649 A1 | 4/2015 | Senzai et al. | |
| 2015/0228526 A1* | 8/2015 | Saeki | C09J 7/401 |
| | | | 438/464 |
| 2016/0046840 A1* | 2/2016 | Yoneyama | C09J 7/243 |
| | | | 428/41.3 |

FOREIGN PATENT DOCUMENTS

| | | |
|---|---|---|
| CN | 1555510 A | 12/2004 |
| CN | 104781912 A | 7/2015 |
| EP | 1 195 809 A2 | 4/2002 |

(Continued)

OTHER PUBLICATIONS

Derwent Abstract of JP 2011-025438. See above for date and inventor.*
International Search Report (PCT/ISA/210) issued in PCT/JP2016/082985, dated Jan. 24, 2017.
Taiwan Office Action for Application No. 105136426 dated Oct. 19, 2017.

(Continued)

*Primary Examiner* — Anish P Desai
(74) *Attorney, Agent, or Firm* — Birch, Stewart, Kolasch & Birch, LLP

(57) ABSTRACT

A mask-integrated surface protective tape, containing:
  a substrate film;
  a temporary-adhesive layer provided on the substrate film; and
  a mask material layer provided on the temporary-adhesive layer;
wherein the mask material layer and the temporary-adhesive layer each contain a (meth)acrylic copolymer; and
wherein the mask-integrated surface protective tape is used for a method of producing a semiconductor chip utilizing a plasma-dicing.

10 Claims, 6 Drawing Sheets

(56) References Cited

FOREIGN PATENT DOCUMENTS

| | | | | |
|---|---|---|---|---|
| JP | 2007-19385 A | 1/2007 | | |
| JP | 2007-281526 A | 10/2007 | | |
| JP | 2008-98228 A | 4/2008 | | |
| JP | 2008-193034 A | 8/2008 | | |
| JP | 2008-226940 A | 9/2008 | | |
| JP | 2009-033154 A | 2/2009 | | |
| JP | 2009-33155 A | 2/2009 | | |
| JP | 2009-141024 A | 6/2009 | | |
| JP | 2009-260272 A | 11/2009 | | |
| JP | 2010-165963 A | 7/2010 | | |
| JP | 2011025438 A | * | 2/2011 | |
| JP | 2011-216513 A | 10/2011 | | |
| JP | 2013-225647 A | 10/2013 | | |
| JP | 2014-523116 A | 9/2014 | | |
| TW | 201539630 A | 10/2015 | | |
| WO | WO-2014030699 A1 | * | 2/2014 | C09J 7/22 |
| WO | WO 2014/080918 A1 | 5/2014 | | |
| WO | WO 2014-157426 A1 | 10/2014 | | |

OTHER PUBLICATIONS

Written Opinion (PCT/ISA/237) issued in PCT/JP2016/082985, dated Jan. 24, 2017.
Extended European Search Report, dated Jun. 7, 2019, for corresponding European Application No. 16864173.6.
Chinese Office Action and Search Report dated Jan. 3, 2020, for corresponding Chinese Patent Application No. 201680020678.3, with partial translation.
Chinese Office Action and Search Report for corresponding Chinese Application No. 201680020678.3, dated Sep. 3, 2020, with English translation of the Office Action.
Japanese Office Action for corresponding Japanese Application No. 2017-528230, dated Sep. 15, 2020, with English translation.
Chinese Office Action dated Apr. 6, 2021 for CN Application No. 201680020678.3 with English Translation.
European Application Communication for corresponding EP Application No. 16 864 173.6 dated Apr. 28, 2021.

* cited by examiner

MASK-INTEGRATED SURFACE PROTECTIVE TAPE

CROSS-REFERENCE TO RELATED APPLICATIONS

This application is a Continuation of PCT International Application No. PCT/JP2016/082985 filed on Nov. 7, 2016, which claims priority under 35 U.S.C. § 119 (a) to Japanese Patent Application No. 2015-219737 filed in Japan on Nov. 9, 2015. Each of the above applications is hereby expressly incorporated by reference, in its entirety, into the present application.

TECHNICAL FIELD

The present invention relates to a mask-integrated surface protective tape.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in the backgrinding step, an etching step or the like, and then dividing the semiconductor wafer into individual chips through a dicing step. In this dicing step, a blade dicing method of cutting the semiconductor wafer with a dicing blade has been used. In this blade dicing method, the cutting resistance by the blade is put directly on the semiconductor wafer at the time of cutting, so that a microscopic crack (or chipping) sometimes occurs in the semiconductor chip by this cutting resistance. Occurrence of the chipping does not only deteriorate outer appearance of the semiconductor chip, but also in some cases, there is a risk that even a circuit pattern on the chip is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street) which is an interval between chips to less than the thick blade width. As a result, the number (yield) of chips gotten from a sheet of wafer decreases. Further, a long time period to be taken for the processing of the wafer is also a problem.

In the dicing step, use is also made of any of various kinds of methods, other than the blade dicing method. There is a DBG (i.e. dicing before grinding) method of, in view of the difficulty in carrying out the dicing after the thinning of the wafer, forming in first a groove with a predetermined thickness in the wafer, and then carrying out a grinding step, and thereby for achieving both the thinning and the singulation into chips at the same time. By using this method, the kerf width is similar to that in the blade dicing method. However, this method has the advantage that the transverse strength of the chip is increased, so that a damage of the chip can be suppressed.

Further, there is a laser dicing method of carrying out a dicing step with a laser. The laser dicing method has an advantage of being able to narrow a kerf width and also to conduct the dicing in dry process. However, there is a disadvantage that a wafer surface is contaminated with a sublimate at the time of cutting with a laser. For this reason, the wafer surface sometimes necessitates being subjected to a pretreatment of protecting it with a predetermined liquid protecting material. Further, the foregoing dry process has not yet led to achievement of a complete dry process. Further, the laser dicing method allows a further speeding-up of the processing rate, compared to the blade dicing method. However, the laser dicing method remains unchanged in carrying out a processing along every one line, and therefore it takes a certain time period for producing an extremely small chip.

In a case of using a wet process, such as a water-jet method of carrying out a dicing step with a water pressure, there is a possibility that a problem occurs in the material which is sensitive to a surface contamination, such as an MEMS device, a CMOS sensor, and the like. There is also a disadvantage that narrowing of a kerf width is limited, so that a chip yield is low.

The stealth dicing method of forming a modifying layer with a laser in the thickness direction of the wafer, and then splitting the modifying layer by expansion to singulate the wafer, has the advantage that a kerf width can be reduced to zero and a processing can be carried out in a dry state. However, a transverse strength of the chip tends to be decreased by the thermal history at the time of forming the modifying layer. Further, silicon debris sometimes occurs at the time of splitting the modifying layer by expansion. Further, there is a risk that the collision of each adjacent chips may be bring about short (or insufficiency) of the transverse strength.

Further, as a combined method of the stealth dicing and the dicing before grinding, there is a chip-singulation method corresponding to a narrow scribe width, which forms in first a modifying layer with only a predetermined width prior to the thinning, and then carrying out a grinding step from the backing-face side, thereby for achieving the thinning and the singulation into chips at the same time. This technique improves the disadvantages of the above mentioned process, and has the advantage that a kerf width is zero and a chip yield is high and also a transverse strength is increased, because a silicon modifying layer is cleaved and singulated by a stress in the wafer backgrinding step. However, because singulation is performed in the backgrinding step, a phenomenon is sometimes occurred, in which an end side of the chip collides with an adjacent chip, and thereby that the chip corner is chipped.

Further, there is a plasma dicing method (for example, see Patent Literature 1). The plasma dicing method is a method of dividing a semiconductor wafer, by selectively etching a portion which is not covered with a mask, using plasma. When this dicing method is used, segmentation of chips can be achieved selectively, and even if the scribe line is curved, the segmentation is possible with no trouble. Further, as the etching rate of the semiconductor wafer is very high, in recent years, this dicing method is considered one of the most suitable steps for the segmentation into chips.

CITATION LIST

Patent Literatures

Patent Literature 1: JP-A-2007-19385 ("JP-A" means unexamined published Japanese patent application)

SUMMARY OF INVENTION

Technical Problem

In the plasma dicing method, use is made of, as a plasma generating gas, a fluorine-based gas which has a very high reactivity with a wafer, such as sulfur hexafluoride ($SF_6$) and carbon tetrafluoride ($CF_4$). For this reason, a protection for a non-etched surface with a mask against such high etching rate is necessary. Therefore, a preliminary mask formation becomes necessary.

In order to form the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step other than the plasma dicing facility. For this reason, there is a problem of increase in chip costs. Further, because of being in a state that a mask (resist film) is remaining after the plasma-etching, it is necessarily to use a large amount of solvent to remove the mask. Nevertheless, the removal of the mask is not always completely performed, which sometimes resulted in occurrence of defective chips. Further, there is also a disadvantage that an overall processing process gets longer period, because of undergoing a masking step with a resist.

The present invention is contemplated to provide a mask-integrated surface protective tape, which does not need a mask formation by a photolithography process in the production of a semiconductor chip using a plasma dicing method, and which, by laminating it on a patterned surface of the semiconductor wafer, is able to protect effectively the patterned surface due to a good adhesion to the patterned surface in the thinning step (backgrinding step) of the semiconductor wafer, and which has a good peeling property between a mask material layer and a temporary-adhesive layer after the thinning step, whereby the mask material layer can be easily exposed on top of the semiconductor wafer, and which allows dicing of the wafer into chips with more certainty and high precision by a $SF_6$ plasma, and further which allows removal of the mask material with more certainty by an $O_2$ plasma after the plasma dicing (after division of the wafer), whereby occurrence of defective chips can be highly prevented.

Solution to Problem

The above-described problems of the present invention are solved by the following means.

[1] A mask-integrated surface protective tape, containing:
  a substrate film;
  a temporary-adhesive layer provided on the substrate film; and
  a mask material layer provided on the temporary-adhesive layer;
wherein the mask material layer and the temporary-adhesive layer each contain a (meth)acrylic copolymer; and
wherein the mask-integrated surface protective tape is used for a method of producing a semiconductor chip containing the following steps (a) to (d):
  (a) a step of, in the state of having laminated the mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;
  (b) a step of, after integrally peeling both the substrate film and the temporary-adhesive layer from the mask-integrated surface protective tape thereby to expose the mask material layer on top, forming an opening by cutting a portion of the mask material layer corresponding to a street of the semiconductor wafer with a laser;
  (c) a plasma-dicing step of segmentalizing the semiconductor wafer on the street by a $SF_6$ plasma, and thereby for singulating the semiconductor wafer into semiconductor chips; and
  (d) an ashing step of removing the mask material layer by an $O_2$ plasma.

[2] The mask-integrated surface protective tape described in the above item [1], wherein the temporary-adhesive layer of the mask-integrated surface protective tape is radiation-curable.

[3] The mask-integrated surface protective tape described in the above item [2],
  wherein the step (b) contains a step of, before integrally peeling the substrate film and the temporary-adhesive layer from the mask-integrated surface protective tape to expose the mask material layer on top, irradiating an ultraviolet ray to the mask-integrated surface protective tape to cure the temporary-adhesive layer,
  wherein, before the curing with ultraviolet irradiation, an adhesive force between the mask material layer and the patterned surface of the semiconductor wafer and an adhesive force between the mask material layer and the temporary-adhesive layer are each 0.2 N/25 mm or more, and
  wherein, after the curing with ultraviolet irradiation, an adhesive force between the mask material layer and the temporary-adhesive layer is lower than an adhesive force between the mask material layer and the patterned surface of the semiconductor wafer.

[4] The mask-integrated surface protective tape described in the above item [2] or [3], wherein the (meth)acrylic copolymer which constitutes the temporary-adhesive layer has an ethylenically unsaturated bond at the side chain thereof.

[5] The mask-integrated surface protective tape described in the above item [4], wherein the monomer component which constitutes the (meth)acrylic copolymer having an ethylenically unsaturated bond at the side chain thereof contains a (meth)acrylic acid alkyl ester component of which the number of carbon atoms in the alcohol portion is from 8 to 12.

[6] The mask-integrated surface protective tape described in any one of the above items [1] to [5], wherein the substrate film contains a polyolefin-series resin layer.

[7] The mask-integrated surface protective tape described in any one of the above items [1] to [6], wherein a difference between the glass transition temperature of the (meth)acrylic copolymer which constitutes the temporary-adhesive layer and the glass transition temperature of the (meth)acrylic copolymer which constitutes the mask material layer is 10° C. or more.

[8] The mask-integrated surface protective tape described in any one of the above items [1] to [7],
  wherein a curing agent is used in both the mask material layer and the temporary-adhesive layer, and
  wherein the curing agent used in the mask material layer and the curing agent used in the temporary-adhesive layer are different in the kind from each other.

[9] The mask-integrated surface protective tape described in any one of the above items [1] to [8], wherein an epoxy-series curing agent is used in the mask material layer, and an isocyanate-series curing agent is used in the temporary-adhesive layer.

[10] The mask-integrated surface protective tape described in any one of the above items [1] to [9], wherein the mask material layer contains a fluorine-series release agent.

[11] A mask-integrated surface protective tape, containing:
a substrate film,
a temporary-adhesive layer provided on the substrate film, and
a mask material layer provided on the temporary-adhesive layer;
wherein the mask material layer and the temporary-adhesive layer each contain a (meth)acrylic copolymer and a curing agent, and
wherein the curing agent contained in the temporary-adhesive layer and the curing agent contained in the mask material layer are different in the kind from each other.

[12] The mask-integrated surface protective tape described in the above item [11], wherein an epoxy-series curing agent is used in the mask material layer, and an isocyanate-series curing agent is used in the temporary-adhesive layer.

[13] The mask-integrated surface protective tape described in the above item [11] or [12], wherein the temporary-adhesive layer of the mask-integrated surface protective tape is radiation-curable.

[14] The mask-integrated surface protective tape described in any one of the above items [11] to [13], wherein the mask material layer contains a fluorine-series release agent.

[15] The mask-integrated surface protective tape described in any one of the above items [11] to [14], which is used for a plasma dicing.

Advantageous Effects of Invention

The mask-integrated surface protective tape of the present invention is a surface protective tape which is able to eliminate the need for a mask formation by a photolithography process in producing the semiconductor chip using a plasma dicing method. According to the mask-integrated surface protective tape of the present invention, by laminating it on a patterned surface of the semiconductor wafer, the patterned surface can be protected effectively due to a good adhesion to the patterned surface in the thinning step of the wafer. The mask-integrated surface protective tape of the present invention has a good peeling property between a mask material layer and a temporary-adhesive layer after the above-described thinning step, whereby the mask material layer can be easily exposed on top of the wafer, which allows dicing of the wafer into chips with more certainty and high precision by $SF_6$ plasma. Further, the mask material layer exposed on top of the wafer can be removed by $O_2$ plasma with more certainty. As a result, by processing the semiconductor wafer using the mask-integrated surface protective tape of the present invention, the occurrence of defective chips can be highly prevented.

Other and further features and advantages of the invention will appear more fully from the following description, appropriately referring to the accompanying drawings.

BRIEF DESCRIPTION OF THE DRAWINGS

FIG. 1(a) shows a semiconductor wafer, fragmentary FIG. 1(b) shows how the mask-integrated surface protective tape is laminated onto the semiconductor wafer, and fragmentary FIG. 1(c) shows a semiconductor wafer on which the mask-integrated surface protective tape is laminated.

FIG. 2(a) shows thinning step of the semiconductor wafer, fragmentary FIG. 2(b) shows how a wafer-fixing tape is laminated to the thinning processed semiconductor wafer, and fragmentary FIG. 2(c) shows a state in which the semiconductor wafer is fixed to a ring flame.

FIG. 3(a) shows how the surface protective tape is peeled off from the mask-integrated surface protective tape while leaving the mask material layer, fragmentary FIG. 3(b) shows a state in which the mask material layer of the mask-integrated surface protective tape is exposed (uncovered), and fragmentary FIG. 3(c) shows a step of cutting off the mask material layer corresponding to the street with a laser.

FIG. 4(a) shows how the plasma dicing is carried out, fragmentary FIG. 4(b) shows a state in which the semiconductor wafer is singulated into chips, and fragmentary FIG. 4(c) shows how the plasma ashing is carried out.

FIG. 5(a) shows a state, in which the mask material layer is removed, and fragmentary FIG. 5(b) shows how the chip is picked up.

FIG. 6(a) shows a state in which both sides of the front and the back of the semiconductor wafer are covered and fixed with the mask-integrated surface protective tape and the wafer-fixing tape, respectively. Fragmentary FIG. 6(b) shows how an ultraviolet light is irradiated. Fragmentary FIG. 6(c) shows how the surface protective tape is peeled off from the mask-integrated surface protective tape while leaving the mask material layer.

MODE FOR CARRYING OUT THE INVENTION

Figure 1A:
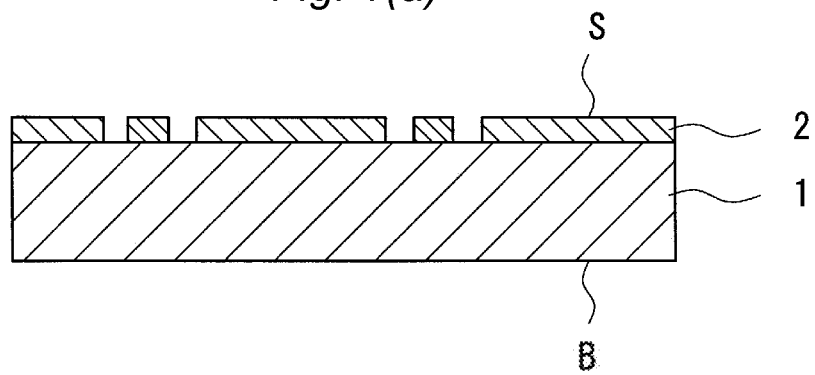
FIGS. 1(a) to 1(c) are schematic cross-sectional views illustrating steps to laminating a surface protective tape onto a semiconductor wafer in the first embodiment using the mask-integrated surface protective tape of the present invention. In the views, fragmentary
Figure 1B:
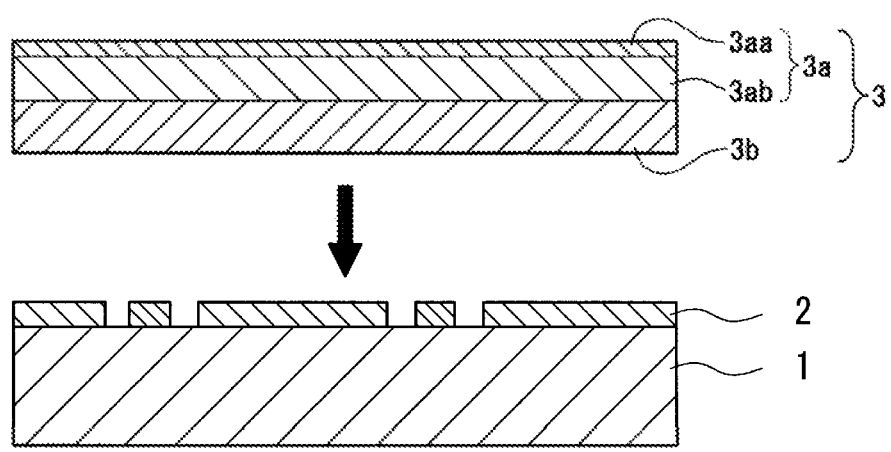
Figure 1B:
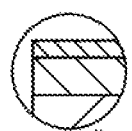
Figure 1C:
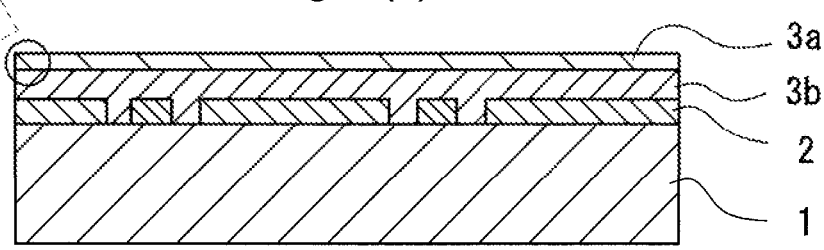

The mask-integrated surface protective tape of the present invention is used for the method of obtaining a semiconductor chip by dividing and singulating a semiconductor wafer with a plasma dicing. As described below, by using the mask-integrated surface protective tape of the present invention, a photolithography process prior to the plasma dicing step becomes unnecessary, whereby production costs of the semiconductor chips and the semiconductor products can be largely suppressed.

The mask-integrated surface protective tape of the present invention has a substrate film, a temporary-adhesive layer provided on the substrate film, and a mask material layer provided on the temporary-adhesive layer, and wherein the mask material layer and the temporary-adhesive layer each contain a (meth)acrylic copolymer. The mask-integrated surface protective tape of the present invention is used for the semiconductor processing. In more details, in order to protect a patterned surface (front surface) of the semiconductor wafer at the time of backgrinding of the semiconductor wafer, the mask-integrated surface protective tape of the present invention is used to laminate it on the patterned surface.

The mask-integrated surface protective tape of the present invention is preferably used for a plasma dicing. Specifically, in obtaining a semiconductor chip from the semiconductor wafer, the mask-integrated surface protective tape of the present invention is preferably used in the production of the semiconductor chip including a step of dividing the wafer to singulate by the plasma dicing.

The mask-integrated surface protective tape of the present invention is preferably used in the production of the semiconductor chip containing at least the following steps (a) to (d):

(a) a step of, in the state of having laminated the mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after integrally peeling both the substrate film and the temporary-adhesive layer from the mask-integrated surface protective tape (in other words, after peeling a surface protective tape from the mask-integrated surface protective tape) thereby to expose the mask material layer on top, forming an opening by cutting a portion of the mask material layer corresponding to a street of the semiconductor wafer with a laser;

(c) a plasma-dicing step of segmentalizing the semiconductor wafer at the street with $SF_6$ plasma, and thereby for singulating the semiconductor wafer into semiconductor chips; and (d) an ashing step of removing the mask material layer with $O_2$ plasma.

In the method of producing a semiconductor chip applied by the mask-integrated surface protective tape of the present invention, the following step (e), after the step (d), is preferably included. When the production method includes following step (e), the following step (f) is preferably included after the step (e).

(e) A step of picking up the semiconductor chip from the wafer-fixing tape, (f) A step of transiting the picked-up semiconductor chip to a die bonding step.

As described above, the mask-integrated surface protective tape of the present invention has a substrate film, a temporary-adhesive layer provided on the substrate film, and a mask material layer provided on the temporary-adhesive layer. In the present specification, a laminated body containing a substrate film and a temporary-adhesive layer provided on this substrate film is sometimes called as "a surface protective tape". In other words, the mask-integrated surface protective tape of the present invention is a tape having a laminated structure in which the mask material layer has been further provided on the temporary-adhesive layer of the surface protective tape.

In the mask-integrated surface protective tape of the present invention, at least the temporary-adhesive layer is preferably radiation-curable (in other words, has a radiation-curing property), and it is more preferable that only the temporary-adhesive layer is radiation-curable. Further, it is preferable that the mask material layer is pressure-sensitive (non-radiation curable).

In a case where the temporary-adhesive layer is radiation-curable, in the above-described step (b), it is preferable to contain a step of curing the temporary-adhesive layer by irradiating a radiation thereto, before integrally peeling both the above-described substrate film and the above-described temporary-adhesive layer from the above-described mask-integrated surface protective tape thereby to expose the mask material layer on top. By curing the temporary-adhesive layer, an interlayer-peeling property between the mask material layer and the temporary-adhesive layer is improved, so that the peeling of the surface protective tape from the mask-integrated surface protective tape becomes easy.

Preferable embodiments of the method of producing a semiconductor chip using the mask-integrated surface protective tape of the present invention (hereinafter, simply referred to as "production method to which the present invention is applied") are described below with reference to the drawings. However, the present invention is not limited to the following embodiments, except for the requirements defined by the present invention. Further, the form shown in each drawing is a schematic view for facilitating the understanding of the present invention. Therefore, regarding the size, the thickness, the relative magnitude relation and the like of each component, the large one or the small one is sometimes changed for the purpose of illustration, and the form does not show a real relation as it is. Further, the present invention is not limited to outer forms and shapes shown in these figures, except for the requirements defined by the present invention.

Preferable embodiments of the production method to which the present invention is applied may be classified into first and second embodiments, as described below.

Note that, as the apparatus, the materials and the like used in the following embodiments, an ordinary apparatus, materials and the like which have been conventionally used in the processing of the semiconductor wafer may be used, unless otherwise indicated, and the conditions of use for them can be appropriately set and optimized in accordance with the intended use within a range of an ordinary method for using. Further, omitted are duplicated descriptions about the materials, structures, methods, effects, and the like, which are common to each embodiment.

First Embodiment [FIGS. 1 to 5]

The first embodiment of a production method to which the present invention is applied is described with reference to FIG. 1 to FIG. 5.

A semiconductor wafer 1 has a patterned face 2 on the surface S of which a circuit or the like of the semiconductor device is formed (see FIG. 1(*a*)). On this patterned surface 2, a mask-integrated surface protective tape 3 in which a mask material layer 3*b* has been further provided on a temporary-adhesive layer 3*ab* of a surface protective tape 3*a* in which the temporary-adhesive layer 3*ab* has been provided on a substrate film 3*aa*, is laminated (see FIG. 1 (*b*)), whereby a semiconductor wafer 1 whose patterned surface 2 is covered with the mask-integrated surface protective tape 3 is obtained (see FIG. 1 (*c*)).

Figure 2A:
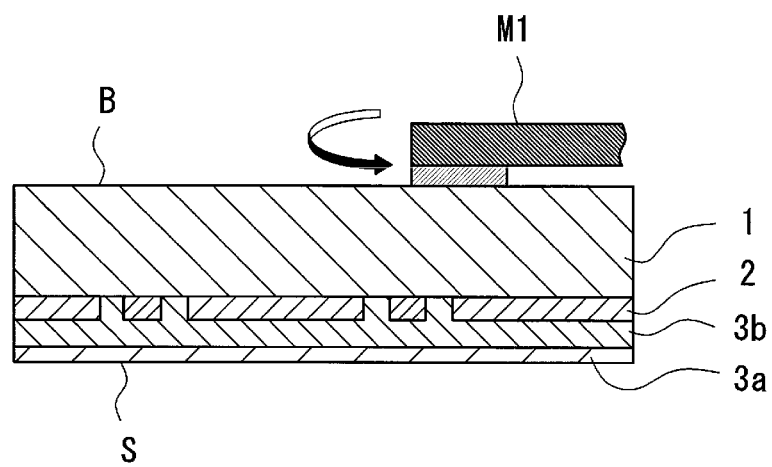
FIGS. 2(a) to 2(c) are schematic cross-sectional views illustrating steps to thinning and fixing of the semiconductor wafer in the first embodiment using the mask-integrated surface protective tape of the present invention. In the views, fragmentary
Figure 2B:
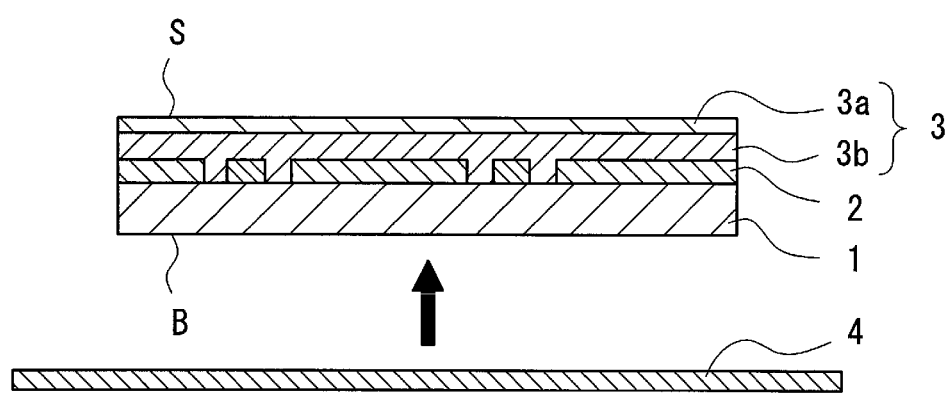
Figure 2C:
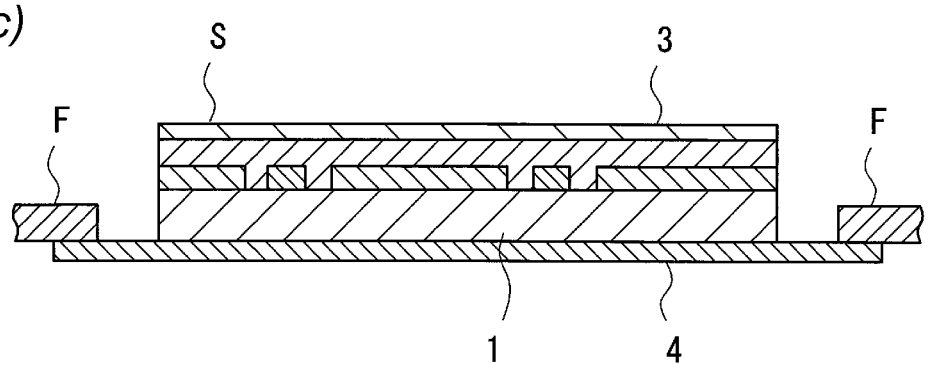

Then, the backing-face B of the semiconductor wafer 1 is ground by a wafer-grinding apparatus M1, to thin a thickness of the semiconductor wafer 1 (see FIG. 2(*a*)). On the ground backing-face B, a wafer-fixing tape 4 is laminated (see FIG. 2(b)), to support and fix the wafer to a ring flame F (see FIG. 2(c)).

Figure 3A:
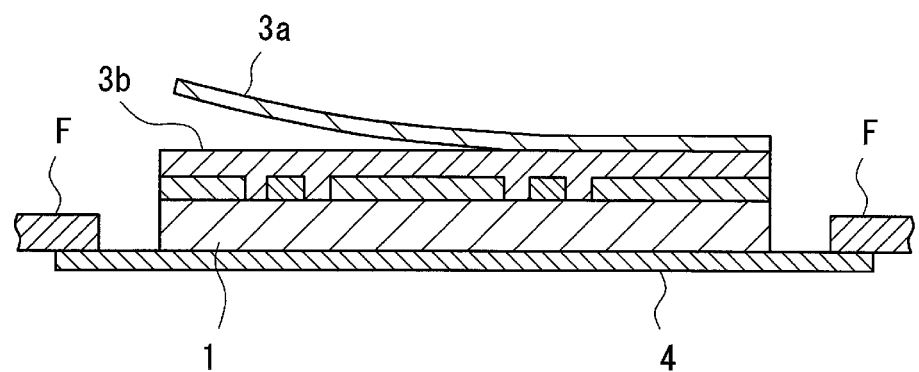
FIGS. 3(a) to 3(c) are schematic cross-sectional views illustrating steps to the mask formation in the first embodiment using the mask-integrated surface protective tape of the present invention. In the views, fragmentary
Figure 3B:
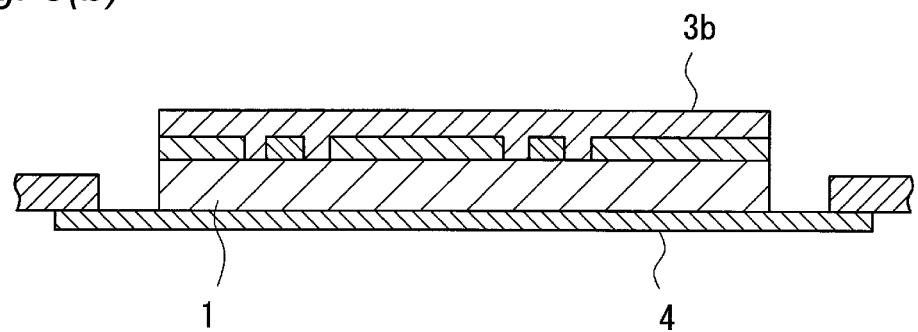
Figure 3C:
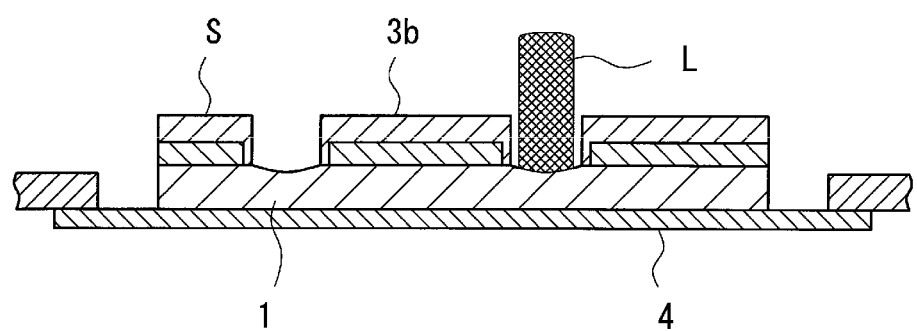

The surface protective tape 3a of the mask-integrated surface protective tape 3 is peeled off from the semiconductor wafer 1, while leaving the mask material layer 3b on the semiconductor wafer 1 (see FIG. 3(a)), so that the mask material layer 3b is exposed (uncovered) (see FIG. 3(b)). Further, $CO_2$ laser L is irradiated from the surface S side toward a plurality of streets (not shown) appropriately formed in a grid pattern or the like onto the patterned face 2, thereby to remove a portion corresponding to a street of the mask material layer 3b, so that streets of the semiconductor wafer are opened (see FIG. 3(c)).

Figure 4A:
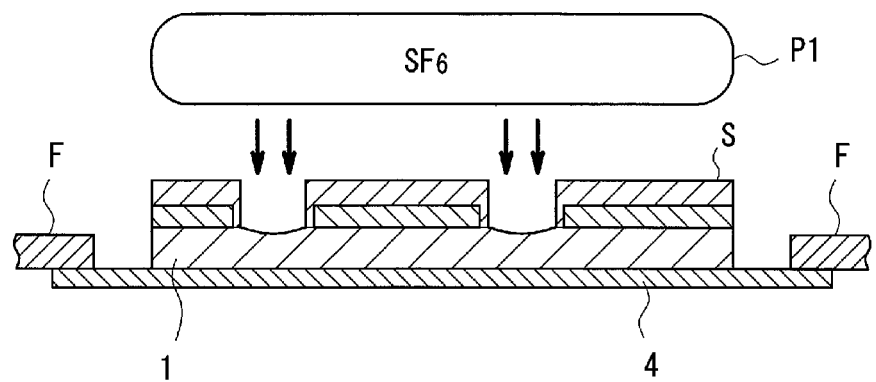
FIGS. 4(a) to 4(c) are schematic cross-sectional views illustrating the plasma dicing and plasma ashing steps in the first embodiment using the mask-integrated surface protective tape of the present invention. In the views, fragmentary
Figure 4B:
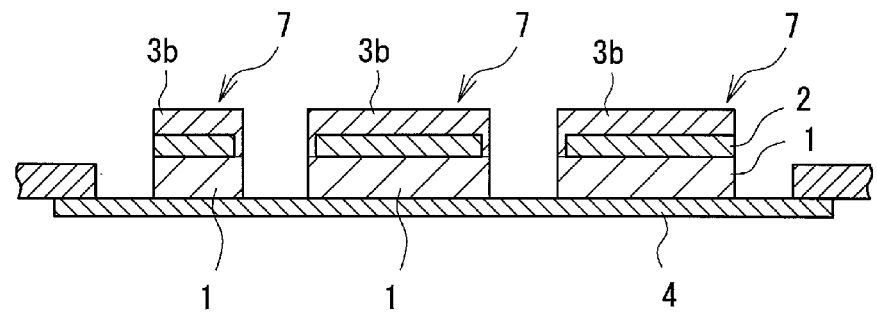
Figure 4C:
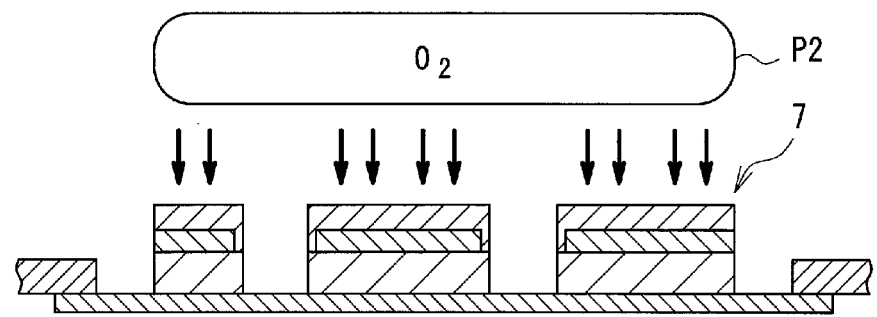
Figure 5A:
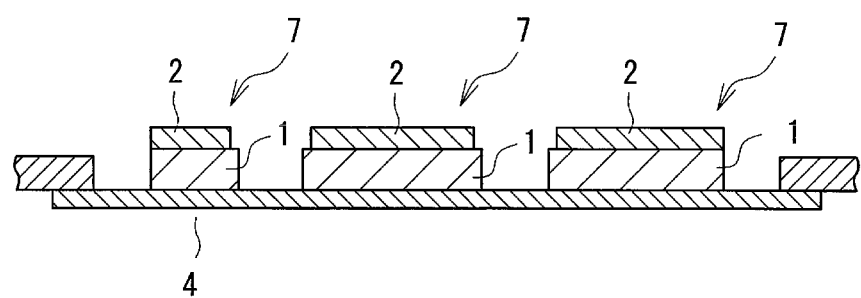
FIGS. 5(a) and 5(b) are schematic cross-sectional views illustrating steps to picking up a chip in the first embodiment using the mask-integrated surface protective tape of the present invention. In the views, fragmentary
Figure 5B:
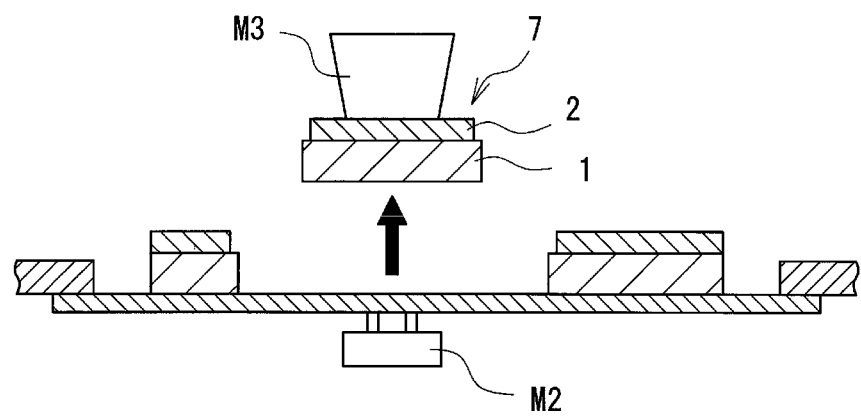

Then, a treatment with the plasma P1 of $SF_6$ gas is carried out from the surface S side, thereby to etch the semiconductor wafer 1 which is exposed at the street portion (see FIG. 4(a)), and the semiconductor wafer is divided into individual chips 7, which results in singulation (see FIG. 4(b)). After that, ashing with the plasma P2 of $O_2$ gas is carried out (see FIG. 4(c)), thereby to remove the mask material layer 3b remaining on the surface S (see FIG. 5(a)). Then, at last, the singulated chip 7 is knocked up by a pin M2, and is picked up by adsorption with a collet M3 (see FIG. 5(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance residue remaining on a semiconductor device surface.

Next, the materials used in the method described above are described. Note that the materials described below are those which can be preferably used in all of the mask-integrated surface protective tape of the present invention and therefore are not limited to the case of using the mask-integrated surface protective tape of the present invention in the above described method.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The mask-integrated surface protective tape 3 of the present invention contains the temporary-adhesive layer 3ab provided on the substrate film 3aa, and further the mask material layer 3b provided on the temporary-adhesive layer 3ab, and has a function to protect the semiconductor device formed on the patterned face 2. Specifically, at the wafer-thinning step (backgrinding step) which is a post-step, the semiconductor wafer 1 is supported by the patterned face 2, and the backing-face of the wafer is ground. Therefore, the mask-integrated surface protective tape 3 needs to withstand a load in grinding. For this reason, the mask-integrated surface protective tape 3 is different from a mere resist film or the like, and has: the thickness enough to coat the device formed on the patterned face; and the pressing resistance which is law, and has: a high adhesiveness that can adhere tightly to the device, so that the infiltration of dusts, grinding water, and the like, in grinding, is not occurred.

Out of the mask-integrated surface protective tape 3 of the present invention, the substrate film 3aa is composed of a plastic, a gum, or the like, and examples of its materials include: a homopolymer or copolymer of α-olefin, such as a polyolefin resin including polyethylene, polypropylene and ethylene/propylene copolymer, polybutene-1, poly-4-methylpentene-1, ethylene/vinyl acetate copolymer, ethylene/acrylic acid copolymer, and ionomers, or a mixture thereof; an elemental substance or a mixture of 2 or more kinds, such as polyethylene terephthalate, polyethylene naphthalate, polyphenylene sulfide, polyether imide, polyimide, polycarbonate, polymethyl methacrylate, polyurethane, and styrene/ethylene/butene- or pentene-based copolymer; and a resin composition in which another resin, a filler, an additive or the like is blended with any of the foregoing polymers. These can be arbitrary selected depending on the required characteristics.

The substrate film 3aa preferably has a layer composed of a polyolefin resin (also referred to as a polyolefin-based resin layer). In this case, the substrate film 3aa may be a single layer composed of a polyolefin resin layer, or may have a multi-layer structure of two or more layers composed of a polyolefin resin layer and other resin layer. A laminate of a low-density polyethylene and an ethylene/vinyl acetate copolymer, a laminate of a polypropylene and a polyethylene terephthalate, a polyethylene terephthalate, or a polyethylene naphthalate is one of preferable materials.

The foregoing substrate film 3aa can be produced using a general extrusion method. In the case where the substrate film 3aa is obtained by laminating various resins, these are produced by a co-extrusion method, a lamination method or the like. At this time, as conventionally practiced in the ordinary production method of the laminate film, an adhesion layer may be provided between resins. A thickness of the substrate film 3aa is preferably from 20 to 200 μm, from the viewpoint of strength/elongation property, and radiation permeation property.

The temporary-adhesive layer 3ab takes a role in protection of the patterned surface together with a mask material layer 3b by covering an asperity of the device formed on the patterned surface to enhance adhesion property to the patterned surface. In order to make the mask-integrated surface protective tape withstand a load of the wafer-thinning step, it is preferable that the adhesion property of the temporary-adhesive layer 3ab to a mask material layer 3b or a substrate film 3aa in the wafer-thinning step is high. On the other hand, after the wafer-thinning step, because the temporary-adhesive layer 3ab is integrally peeled with the substrate film 3aa from the mask material layer 3b, it is preferable that the adhesion property of the temporary-adhesive layer to the mask material layer is low (high peeling property is preferable). In order to achieve these properties in higher level, it is preferable to adopt a radiation-curable temporary-adhesive in the temporary-adhesive layer 3ab. By rendering the temporary-adhesive layer 3ab radiation-curable, the resin constituting the temporary-adhesive layer becomes 3-dimentionally reticulated by radiation irradiation, which results in reduction of the adhesive force. For this reason, by ultraviolet irradiation after the wafer-thinning step, a rigid adhesion to the mask material layer is released and resultantly the temporary-adhesive layer can be simply peeled from the mask material layer (such specific embodiments are described below).

In the present specification, the term "radiation" is a concept including both a light beam such as ultraviolet, and an ionizing radiation such as an electron beam. The radiation for use of the present invention is preferably ultraviolet.

In the mask-integrated surface protective tape of the present invention, the temporary-adhesive layer 3ab contains a (meth)acrylic copolymer. Herein, the phrase "the temporary-adhesive layer 3ab contains a (meth)acrylic copolymer" means to incorporate an embodiment in which the (meth)acrylic copolymer exists in a reacted state with a curing agent described below.

In the present specification, examples of the (meth)acrylic copolymer include a copolymer having a (meth)acrylic acid ester as a constituent, or a mixture of these copolymers. The mass-average molecular weight of these polymers is normally about 300,000 to 1,000,000. A proportion of the (meth)acrylic acid ester component of the total monomer component of the (meth)acrylic copolymer is preferably 70% or more, more preferably 80% or more, and further more preferably 90% or more. Further, in a case where the proportion of the (meth)acrylic acid ester component of the total monomer component of the (meth)acrylic copolymer is not 100% by mole, it is preferable that the remaining monomer component is a monomer component (constituent and the like derived from (meth)acrylic acid) existing in the form of (meth)acryloyl group polymerized as a polymerizable group. Further, the proportion of the (meth)acrylic acid ester component having a functional group (for example, hydroxyl group) reacting with a curing agent described below, of the total monomer component of the (meth)acrylic copolymer is preferably 1% by mole or more, more preferably 2% by mole or more, further more preferably 5% by mole or more, and still further more preferably 10% by mole or more. A proportion of the (meth)acrylic acid ester component is preferably 35% by mole or less, more preferably 25% by mole or less.

The above-described (meth)acrylic acid ester component is preferably a (meth)acrylic acid alkyl ester (also referred to as alkyl (meth)acrylate). The number of carbon atoms of the alkyl group which constitutes the (meth)acrylic acid alkyl ester is preferably from 1 to 20, more preferably from 1 to 15, and further more preferably from 1 to 12.

The content (content converted to the state before reacting with a curing agent) of the (meth)acrylic copolymer in the temporary-adhesive layer 3ab is preferably 80% by mass or more, more preferably 90% by mass or more, and still more preferably from 95 to 99.9% by mass.

In a case where the temporary-adhesive layer 3ab is composed of a radiation-curable temporary-adhesive, a temporary-adhesive containing an acrylic temporary-adhesive and a radiation-polymerizable compound may be preferably used.

The acrylic temporary-adhesive is a (meth)acrylic copolymer, or a mixture of a (meth)acrylic copolymer and a curing agent.

The curing agent is used to adjust an adhesive force and a cohesion force by reacting it with a functional group which the (meth)acrylic copolymer has. Examples thereof include: an epoxy compound having 2 or more epoxy groups in the molecule (hereinafter, also referred to as "epoxy-series curing agent"), such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, N,N,N', N'-tetraglycidyl-m-xylenediamine, ethylene glycol diglycidyl ether, or terephthalic acid diglycidyl ester acrylate; an isocyanate compound having 2 or more isocyanate groups in the molecule (hereinafter, also referred to as "isocyanate-series curing agent"), such as 2,4-tolylenediisocyanate, 2,6-tolylenediisocyanate, 1,3-xylylenediisocyanate, 1,4-xylylenediisocyanate, diphenylmethane-4,4'-isocyanate, hexamethylene diisocyanate, isophorone diisocyanate, or an adduct type of these; an aziridine compound having 2 or more aziridinyl groups in the molecule (aziridine-series curing agent), such as tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine)propionate, tris-2,4,6-(1-aziridinyl)-1,3,5-triazine, tris[1-(2-methyl)-aziridinyl]phosphine oxide, or hexa[1-(2-methyl)-aziridinyl]triphosphatriazine; and the like. An addition amount of the curing agent may be adjusted depending on a desired adhesion force, and is suitably from 0.1 to 5.0 mass parts with respect to 100 mass parts of the (meth)acrylic copolymer. In the temporary-adhesive layer of the mask-integrated surface protective tape used of the present invention, the curing agent is in a state of having reacted with the (meth)acrylic copolymer.

As for the radiation-polymerizable compound described above, a low-molecular weight compounds having, in the molecule, at least two or more photopolymerizable carbon-carbon double bonds which can be three-dimensionally reticulated by radiation irradiation are widely used. Specifically, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, and acrylate-based compounds such as oligo-ester acrylates.

Further, in addition to the acrylate-based compounds, use can be also made of a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

As a blending ratio of the acrylic temporary-adhesive and the radiation-polymerizable compound in the radiation-curable temporary-adhesive, the radiation-polymerizable compound is desirably blended in the range of 50 to 200 mass parts and preferably 50 to 150 mass parts with respect to 100 mass parts of the acrylic temporary-adhesive. If the blending ratio is in this range, it is possible to decline sharply the adhesion force of the temporary-adhesive layer after radiation irradiation.

Further, as the radiation-curable temporary-adhesive used in the temporary-adhesive layer 3ab, it is also preferable to use a radiation-polymerizable (meth)acrylic copolymer in which the above-described (meth)acrylic copolymer itself has been rendered radiation-polymerizable. In this case, the radiation-curable temporary-adhesive may contain a curing agent.

The radiation-polymerizable (meth)acrylic copolymer is a copolymer having, in the molecule of the copolymer, a reactive group which is capable of realizing a polymerization reaction upon exposure to a radiation, particularly to an ultraviolet. As the reactive group, an ethylenically unsaturated group, in other words, a group having a carbon-carbon double bond (ethylenically unsaturated bond), is preferred. Examples thereof include: a vinyl group, an allyl group, a styryl group, a (meth)acryloyloxy group, a (meth)acryloylamino group, and the like. The (meth)acrylic copolymer preferably has an ethylenically unsaturated bond at the side chain thereof. The content of the ethylenically unsaturated bond of the (meth)acrylic copolymer is preferably from 0.05 to 10 meq/g, and more preferably from 0.5 to 5 meq/g.

The introduction of the above-described reactive group to the copolymer may be performed, for example, by reacting a copolymer having a hydroxyl group with a compound having both a group (for example, isocyanate group) reacting with the hydroxyl group and the above-described reactive group [representatively 2-(methacryloyloxy)ethyl isocyanate].

It is preferable that a (meth)acrylic acid alkyl ester component of which the number of carbon atoms in the alcohol portion is from 8 to 12 is contained in the monomer components which constitute the (meth)acrylic copolymer having an ethylenically unsaturated bond at the side chain thereof, which constitutes the temporary-adhesive layer 3ab of the mask-integrated surface protective tape of the present invention. Of the monomer components which constitute the (meth)acrylic copolymer having an ethylenically unsaturated bond at the side chain thereof, the percentage of the (meth)acrylic acid alkyl ester component of which the number of carbon atoms in the alcohol portion is from 8 to 12 is preferably from 45 to 85% by mole, and more preferably from 50 to 80% by mole.

Herein, the "alcohol portion" of the (meth)acrylic acid alkyl ester component means a structure derived from an alcohol which forms an ester bond (in contrast, a structure derived from a (meth)acrylic acid of the (meth)acrylic acid alkyl ester component is called an acid portion). For example, in a case where the (meth)acrylic acid alkyl ester component is a 2-ethylhexyl acrylate component, the alcohol portion is a structure derived from 2-ethylhexanol and the acid portion is a structure derived from acrylic acid, so that the number of carbon atoms in the alcohol portion is 8. Further, in a case where the (meth)acrylic acid alkyl ester component is a lauryl acrylate component, the alcohol portion is a structure derived from 1-dodecanol and the acid portion is a structure derived from acrylic acid, so that the number of carbon atoms in the alcohol portion is 12.

Further, in the case of conducting polymerization and curing of a temporary-adhesive layer 3ab by radiation, a photopolymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylphenyl propane, and the like can be used. By adding at least one of these compounds to the temporary-adhesive layer, a polymerization reaction can be efficiently accelerated.

The temporary-adhesive layer 3ab may further contain a photosensitizer, any of known tackifier, softener, antioxidant, or the like.

As for the temporary-adhesive layer 3ab, those embodiments described at paragraphs [0036] to [0055] of JP-A-2014-192204 are also preferably applied.

The thickness of the temporary-adhesive layer 3ab is preferably from 5 to 100 μm, from the viewpoint of more increasing protective ability to the device and the like formed on the patterned surface 2, and more increasing adhesion to the patterned surface. In this regard, depending on the variety of the device, an asperity of the patterned surface is approximately about a few micrometers to about 15 μm, and therefore the thickness of the temporary-adhesive layer 3ab is preferably from 5 to 30 μm.

In the mask material layer 3b, a (meth)acrylic copolymer is contained. Herein, the phrase "a (meth)acrylic copolymer is contained in the mask material layer 3b" means to incorporate an embodiment in which the (meth)acrylic copolymer exists in a reacted state with a curing agent.

In the mask material layer 3b, a non-radiation curable, so-called pressure-sensitive temporary-adhesive is preferably used. As this pressure-sensitive temporary-adhesive, a mixture of the above-described (meth)acrylic copolymer and a curing agent may be preferably used.

Further, it is also preferable that the mask material layer 3b contains a fluorine-series release agent. Examples of the fluorine-series release agent include MEGAFAC (trade name, manufactured by DIC Corporation).

The thickness of the mask material layer 3b is preferably from 5 to 100 μm, and more preferably from 5 to 30 μm, from the view point of a removal rate in the plasma ashing.

In the mask-integrated surface protective tape of the present invention, it is preferable that the curing agent used for forming the temporary-adhesive layer 3ab and the curing agent used for forming the mask material layer 3b (the description about the curing agent in the above-described temporary-adhesive layer may be preferably used) are different in its kind from each other. By using such a different curing agent from each other, a cross-linked structure of each layer can be controlled. If these layers form the same cross-linked structure, a cross-linkage is caused between the mask material layer and the temporary-adhesive layer with the lapse of time, so that it becomes difficult to leave the mask material layer on a wafer.

In particular, it is preferable that an isocyanate-series curing agent is used as the curing agent for forming the temporary-adhesive layer 3ab and an epoxy-series curing agent is used as the curing agent for forming the mask material layer 3b. By this constitution, only a mask material layer can be easily left on the wafer.

In the mask-integrated surface protective tape of the present invention, a difference between the glass transition temperature (Tg) of the (meth)acrylic copolymer for forming the temporary-adhesive layer 3ab and the glass transition temperature of the (meth)acrylic copolymer for forming the mask material layer 3b is preferably 10° C. or more, and more preferably 10 to 50° C.

If a difference of the glass transition temperatures gets to 10° C. or more, an interlayer adhesive force is decreased, so that peeling can be easily achieved between the mask material layer and the temporary-adhesive layer. Further, by setting the difference of the glass transition temperatures to 50° C. or less, an interlayer adhesive force between the mask material layer and the temporary-adhesive layer can be easily kept to an adequate strength, so that a risk for developing a dust intrusion and a wafer breakage can be more decreased.

Herein, the Tg of the (meth)acrylic copolymer for forming the above-described temporary-adhesive layer 3ab and the Tg of the (meth)acrylic copolymer for forming the above-described mask material layer 3b each mean a Tg of the (meth)acrylic copolymer in the state before reacting with the curing agent.

It is preferable that the glass transition temperature of the temporary-adhesive layer 3ab is lower than the glass transition temperature of the mask material layer 3b.

The Tg can be measured using a differential scanning calorimetric analyzer (DSC-60, manufactured by Shimadzu Corporation). More specifically, the temperature rise is conducted at a rate of temperature rise of 5° C./min in a range of −100° C. to 100° C., and the extrapolated onset glass transition temperature in JIS K 7121 "Testing Method for Transition Temperature of Plastics" is defined as Tg.

In the mask-integrated surface protective tape of the present invention, an adhesive force between the mask material layer 3b and the patterned surface 2 of the semiconductor wafer is preferably 0.2N/25 mm or more, and more preferably from 1.0 to 20N/25 mm. Further, an adhesive force between the mask material layer 3b and the temporary-adhesive layer 3ab is preferably 0.2N/25 mm or more, and more preferably from 1.0 to 5.0N/25 mm. By having this adhesive force, an adhesion property enough to withstand a load in the wafer-thinning process can be obtained.

In the present specification, the term "adhesive force" (unit: N/25 mm) is obtained by making a 5-mm width incision in a mask-integrated surface protective tape with a cutter, and then pulling a mask material layer at a peeling rate of 300 mm/min in the direction of 180° to peel the mask material layer away from the mask-integrated surface protective tape, and measuring a stress (peeling strength) at that moment, using a TENSILON tester (AG-10kNl (trade name), manufactured by Shimadzu Corporation).

In a case where a radiation curable temporary-adhesive is used in the temporary-adhesive layer 3ab of the mask-integrated surface protective tape of the present invention and the temporary-adhesive layer 3ab is cured by ultraviolet irradiation after the wafer-thinning process, it is preferable that an adhesive force between the mask material layer 3b and the patterned surface 2 of the semiconductor wafer, and an adhesive force between the mask material layer 3b and temporary-adhesive layer 3ab are each 0.2N/25 mm or more before curing by the ultraviolet irradiation. Further, it is preferable that, after curing of the temporary-adhesive layer 3ab by the ultraviolet irradiation, an adhesive force between the mask material layer 3b and temporary-adhesive layer 3ab becomes lower than an adhesive force between the mask material layer 3b and the patterned surface 2 of the semiconductor wafer.

Herein, measurement of the above-described adhesive force is conducted under the conditions that an ultraviolet ray is irradiated to all over the mask-integrated surface protective tape from the substrate film side of the tape so that the accumulated radiation dose gets to 500 mJ/cm². A high-pressure mercury lamp is used for the ultraviolet irradiation.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required. As the foregoing wafer-fixing tape 4, a tape similar to the surface protective tape 3a may be used. Further, use may be made of any of known dicing tapes used in a conventional plasma dicing method, which are generally called as a dicing tape. Further, the use can be also made of a dicing die-bonding tape, in which an adhesion bond for die-bonding is laminated between the temporary-adhesive layer and the substrate film, in order to make it easy to transit to the dicing die-bonding step after picking-up.

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged.

Laser can be irradiated, which is provided with an output controlled suitably to remove the mask material layer 3b. In particular, if $CO_2$ laser is used as a laser light, it is possible to obtain a large power of several to tens of watts. $CO_2$ laser can be preferably used for the present invention.

In order to carry out the plasma dicing and the plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of producing the semiconductor chip (the method of processing the semiconductor wafer), any photolithographic step or the like becomes unnecessary, which is provided with a resist to be used in the conventional plasma dicing process, by giving a mask function in the plasma dicing to the surface protective tape protecting the patterned face. In particular, by using the surface protective tape, a technique becomes unnecessary, in which a high level of alignment, such as printing and transferring, is required for the mask formation. The mask-integrated surface protective tape of the present invention can be easily laminated on the semiconductor wafer surface, and a mask can be easily formed by the laser equipment.

Further, the mask material layer 3b can be removed with $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Figure 6A:
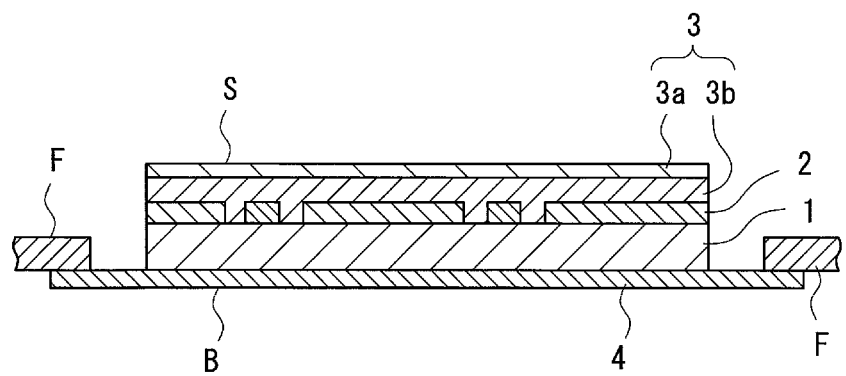
FIGS. 6(a) to 6(c) are schematic cross-sectional views illustrating a state before and after a treatment with an ultraviolet irradiation carrying out in the second embodiment using the mask-integrated surface protective tape of the present invention. In the views, Fragmentary
Figure 6B:
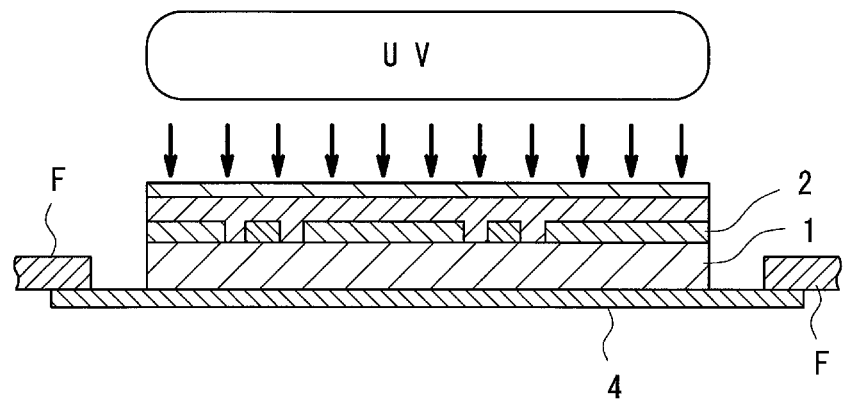
Figure 6C:
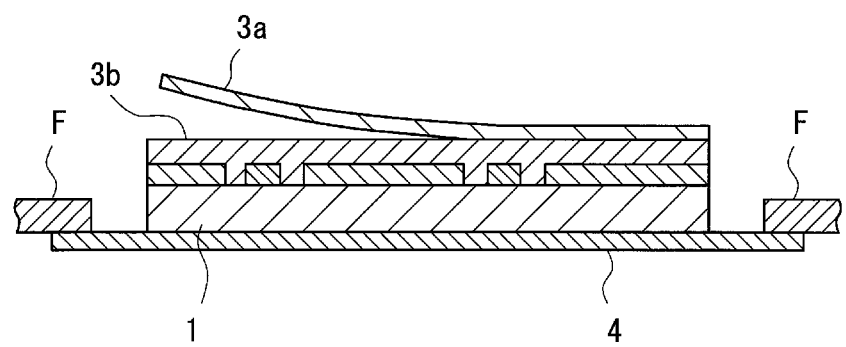

Second Embodiment [FIGS. 6(a) to 6(c)]

This embodiment is different from the first embodiment in the point that the second embodiment contains a step of curing the temporary-adhesive layer by irradiating the mask-integrated surface protective tape 3 with a radiation, such as an ultraviolet light or the like, prior to the step of peeling-off the surface protective tape 3a in the first embodiment. Other steps are the same as in the first embodiment.

Specifically, the mask-integrated surface protective tape 3 is laminated on the surface S side of the semiconductor wafer 1, and the wafer-fixing tape 4 is laminated on the ground backing-face B side of the semiconductor wafer 1, followed by supporting and fixing the wafer to a ring flame F (see FIG. 2(c), FIG. 6(a)). Then, an ultraviolet light UV is irradiated from the surface S side toward the mask-integrated surface protective tape 3 (see FIG. 6(b)). Then, after curing the temporary-adhesive layer 3ab of the mask-integrated surface protective tape 3, the surface protective tape 3a is removed (see FIG. 6(c)), whereby the mask material layer 3b is uncovered. Then, this step is transited to a step of cutting, with a laser L, a portion of the mask material layer 3b corresponding to the street.

In the mask-integrated surface protective tape that can be used in this embodiment, at variation with the mask-integrated surface protective tape 3 described in the first embodiment, a material which is capable of being cured with a radiation, such as an ultraviolet ray or the like, is used in the temporary-adhesive layer 3ab.

By curing the temporary-adhesive layer 3ab with the ultraviolet light or the like, peeling-off of the surface protective tape 3a from mask material layer 3b is made easily performed.

Each of the above-described embodiments is an example of the present invention and therefore the present invention is not limited to these embodiments. Accordingly, addition, deletion, modification and the like of a known process may be made in each process to the extent of no departure from the scope of the present invention.

EXAMPLES

The present invention will be described in more detail based on examples given below, but the invention is not meant to be limited by these.

[Example 1] Production of Mask-Integrated Surface Protective Tape, and Production of Semiconductor Chip <Production of Mask-Integrated Surface Protective Tape>

Were mixed 1.0 mol % of methacrylic acid, 78 mol % of 2-ethylhexyl acrylate and 21 mol % of 2-hydroxyethyl acrylate. The mixture was subjected to a solution polymerization to obtain a solution of (meth)acrylic copolymer having a mass-average molecular weight of 700,000.

To the obtained copolymer, 2-methaclyroyloxyethyl isocyanate (trade name: KARENZ MOI, Showa Denko K.K.) was adjoined to obtain a (meth)acrylic copolymer having the specific physical properties (mass-average molecular weight: 700,000, double bonding amount: 0.90 meq/g, hydroxyl group value: 33.5 mg KOH/g, acid value: 5.5 mg KOH/g, Tg: −68° C.).

To 100 mass parts of this ethylenically unsaturated group-containing (meth)acrylic copolymer, 2.0 mass parts of COLONATE L (isocyanate-series curing agent, manufactured by Nippon Polyurethane Industry Co., Ltd.) as a curing agent, and 5.0 mass parts of IRGACURE 184 (manufactured by BASF) as a photopolymerization initiator were blended to obtain a temporary-adhesive composition A.

An acrylic copolymer (mass-average molecular weight: 400,000, hydroxyl value: 0 mg KOH/g, acid value: 48.8 mg KOH/g, Tg: −23° C.) was synthesized by mixing 20 mol % of acrylic acid, 70 mol % of butyl acrylate and 10 mol % of methyl acrylate and subjecting the mixture solution to polymerization.

To this acrylic copolymer solution, 2.0 parts by mass of TETRAD-X (manufactured by Mitsubishi Gas Chemical Company, Inc., epoxy-based curing agent) was blended with respect to 100 parts by mass of the copolymer to obtain a temporary-adhesive composition B.

The above-described temporary-adhesive composition A was coated on a peeling liner, and the formed temporary-adhesive layer was laminated on a 100 μm-thick LDPE (low density polyethylene) film to obtain a 130 μm-thick ultraviolet curable mask-integrated surface protective tape 3a.

Further, the temporary-adhesive composition B was coated on a peeling liner so that the thickness after drying got to 10 μm, and then laminated on the surface of the temporary-adhesive layer exposed by peeling the peeling liner of the ultraviolet curable surface protective tape 3a, whereby a 140 μm-thick ultraviolet curable mask-integrated surface protective tape 3 was obtained.

<Production of Semiconductor Chip>

The above-obtained ultraviolet curable mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 μm. The ground wafer was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ from the ultraviolet curable mask-integrated surface protective tape side using a high pressure mercury lamp, an adhesive force between the mask material layer 3b and the surface protective tape 3a was decreased, and only the surface protective tape 3a was peeled while leaving only the mask material layer 3 on the wafer. Herein, from the results that only the surface protective tape 3a was peeled while leaving the mask material layer 3b, it was found that, after the ultraviolet irradiation, the adhesive force between the mask material layer and the temporary-adhesive layer was lower than the adhesive force between the mask material layer and the wafer.

Next, the mask material on the scribe line was removed by a $CO_2$ laser to form an opening on the scribe line.

After that, the silicon wafer was subjected to a plasma irradiation with a $SF_6$ gas as a plasma-generating gas from the mask material layer side at an etching rate of 15 μm/min for 5 minutes. By this plasma dicing, the wafer was cut and divided into individual chips. Next, the chips were subjected to ashing with an $O_2$ gas as a plasma-generating gas at an etching rate of 1.5 μm/min for 10 minutes thereby to remove the mask material. After that, an ultraviolet ray was irradiated (irradiation dose: 200 mJ/cm$^2$) from the dicing tape side thereby to decrease an adhesive force of the dicing tape, and chips were picked up.

In the above-described Example 1, the 25 mm-width mask-integrated surface protective tape was laminated on the silicon wafer. After that, an adhesive force was measured at a peeling angle of 180° and a peeling rate of 300 mm/min. As a result, in 1.6N/25 mm, peeling between the mask material layer and the wafer surface was confirmed. From this result, it was confirmed that the adhesive force between the mask material layer and the temporary-adhesive layer was also 1.6N/25 mm or more.

[Example 2] Production of Mask-Integrated Surface Protective Tape, and Production of Semiconductor Chip <Production of Mask-Integrated Surface Protective Tape>

To 100 parts by mass of SG-600TEA (trade name, manufactured by Nagase Chemtex Corporation, (meth)acrylic copolymer, mass-average molecular weight: 1,200,000, hydroxyl group value: 20 mg KOH/g, acid value: 0 mg KOH/g, Tg: −32° C.), 2.0 parts by mass of COLONATE L (manufactured by Nippon Polyurethane Industry Co., Ltd.) as a curing agent was blended to obtain a temporary-adhesive composition C.

The obtained temporary-adhesive composition C was coated on a peeling liner and the formed temporary-adhesive layer was laminated on a 100 µm-thick LDPE (low density polyethylene) film to obtain a 130 µm-thick pressure-sensitive surface protective tape 3*a*.

Further, the temporary-adhesive composition B was coated on a peeling liner so that the thickness after drying got to 10 µm, and then was laminated on the surface of the temporary-adhesive layer exposed by peeling the peeling liner of the above-described pressure-sensitive surface protective tape, whereby a pressure-sensitive mask-integrated surface protective tape 3 having a total thickness of 140 µm was obtained.

<Production of Semiconductor Chip>

The above-obtained pressure-sensitive mask-integrated surface protective tape was laminated on the surface of a silicon wafer (diameter: 8 inches) having thereon scribe lines using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, only the surface protective tape 3*a* was peeled, while leaving only the mask material layer 3*b* on the wafer.

After that, in the same manner as in Example 1, except that the ultraviolet irradiation was not carried out, in other words, similarly to Example 1, an opening was formed on the scribe line and then the plasma dicing and the ashing were carried out, and then chips were picked up.

[Example 3] Production of Mask-Integrated Surface Protective Tape, and Production of Semiconductor Chip <Production of Mask-Integrated Surface Protective Tape>

Were mixed 1.0 mol % of methacrylic acid, 53 mol % of lauryl acrylate, 26 mol % of 2-hydroxyethyl acrylate and 20 mol % of 2-ethylhexyl acrylate. The mixture was subjected to a solution polymerization to obtain a solution of (meth) acrylic copolymer having a mass-average molecular weight of 300,000.

To the obtained copolymer, 2-methaclyroyloxyethyl isocyanate (trade name: KARENZ MOI, Showa Denko K.K.) was adjoined to obtain a (meth)acrylic copolymer having the specific physical properties (mass-average molecular weight: 300,000, double bonding amount: 0.59 meq/g, hydroxyl group value: 55.6 mg KOH/g, acid value: 5.5 mg KOH/g, Tg: −20° C.).

To 100 mass parts of this ethylenically unsaturated group-containing (meth)acrylic copolymer, 2.0 mass parts of COLONATE L (manufactured by Nippon Polyurethane Industry Co., Ltd.) as a curing agent, and 5.0 mass parts of IRGACURE 184 (manufactured by BASF) as a photopolymerization initiator were blended to obtain a temporary-adhesive composition D.

The above-described temporary-adhesive composition D was coated on a peeling liner and the formed temporary-adhesive layer was laminated on the LDPE layer of a 100 µm-thick laminate film of PET (polyethylene terephthalate) and LDPE (low density polyethylene) (layer constitution 25 µm: 75 µm) to obtain a 130 µm-thick ultraviolet curable surface protective tape 3*a*.

Further, the temporary-adhesive composition B prepared in the above-described Example 1 was coated on a peeling liner so that the thickness after drying got to 10 µm, and then was laminated on the surface of the temporary-adhesive layer exposed by peeling the peeling liner of the ultraviolet curable surface protective tape, whereby an ultraviolet curable mask-integrated surface protective tape 3 having a total thickness of 140 µm was obtained.

<Production of Semiconductor Chip>

The above-obtained ultraviolet curable mask-integrated surface protective tape was laminated on the surface of a silicon wafer (diameter: 8 inches) having thereon scribe lines using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 µm. The ground wafer was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm² from the ultraviolet curable mask-integrated surface protective tape side using a high pressure mercury lamp, an adhesive force between the mask material layer 3*b* and the surface protective tape 3*a* was decreased, and only the surface protective tape 3*a* was peeled while leaving only the mask material layer 3 on the wafer. Herein, from the results that only the surface protective tape 3*a* was peeled while leaving the mask material layer 3*b*, it was found that, after the ultraviolet irradiation, the adhesive force between the mask material layer and the temporary-adhesive layer was lower than the adhesive force between the mask material layer and the wafer.

After that, similarly to Example 1, an opening was formed on the scribe line and then the plasma dicing and the ashing were carried out, and after ultraviolet irradiation, chips were picked up.

In the above-described Example 3, the 25 mm-width integrated tape was laminated on the silicon wafer. After that, an adhesive force was measured at a peeling angle of 180° and a peeling rate of 300 mm/min. As a result, in 2N/25 mm, peeling between the mask material layer and the wafer surface was confirmed. From this result, it was confirmed that the adhesive force between the mask material layer and the temporary-adhesive layer is also 2N/25 mm or more.

[Comparative Example 1] Mask Formation by Photolithography Process, Preparation of Surface Protective Tape, and Production of Semiconductor Chip <Preparation of Wafer with Mask>

A silicon wafer having a chip size of 10 mm×10 mm and having thereon 8 inches scribe line with a scribe line width of 70 µm was prepared using a laser. On the prepared wafer having a scribe line, a positive-working light-sensitive material was coated to form a 10 µm-thick resist mask layer. An ultraviolet irradiation was conducted only on the scribe line using a photomask and then the resist on the scribe line was removed with an alkaline developer to prepare a wafer with a mask.

<Preparation of Pressure-Sensitive Surface Protective Tape>

To 100 parts by mass of KP-1909B (trade name, manufactured by Nippon Carbide Industries Co., Inc.), 1.0 mass parts of COLONATE L (trade name, manufactured by Nippon Polyurethane Industry Co., Ltd.) as a curing agent was blended to obtain a temporary-adhesive composition.

This temporary-adhesive composition was coated on a peeling liner so as to be a thickness of 30 μm, and then was laminated on a corona-treated surface of the 100 μm-thick LDPE (low density polyethylene) film to obtain a 130 μm-thick pressure-sensitive surface protective tape.

<Production of Semiconductor Chip>

The above-described pressure-sensitive surface protective tape was laminated on the mask of the above-prepared silicon wafer with a mask using a laminator DR8500III (trade name, manufactured by Nitto Seiki Co., Ltd.).

After that, the backing-face of the above-described silicon wafer with a mask was ground using DGP8760 (trade name, manufactured by DISCO Corporation) until a thickness of the wafer got to 50 μm. The ground silicon wafer with a mask material was mounted on a dicing tape from the wafer backing-face side using RAD-2700F (trade name, manufactured by Lintec Corporation), and was supported and fixed to a ring flame. After that, the pressure-sensitive surface protective tape was peeled.

After that, the wafer was divided into chips by the plasma dicing in the same manner as in Example 1. Next, the mask was removed by ashing in the same manner as in Example 1, and further the chips were picked up in the same manner as in Example 1.

[Comparative Example 2] Mask Formation by Photolithography Process, Preparation of Surface Protective Tape, and Production of Semiconductor Chip <Preparation of Wafer with Mask>

A silicon wafer with a mask was prepared by a photolithography process in the same manner as in Comparative Example 1.

<Preparation of Ultraviolet-Curable Surface Protective Tape>

20 mol % of methacrylic acid, 30 mol % of 2-ethylhexyl acrylate, 10 mol % of 2-hydroxyethyl acrylate, and 40 mol % of methyl acrylate were mixed, and the mixture was subjected to a solution polymerization to obtain a solution of a polymer having a mass-average molecular weight of 600,000.

To the forgoing (meth)acrylic copolymer solution, 100 parts by mass of a 6-functional urethane acrylate oligomer (manufactured by Shin-Nakamura Chemical Co., Ltd.) and 50 parts by mass of a 3-functional urethane acrylate oligomer (manufactured by Shin-Nakamura Chemical Co., Ltd.) as an ultraviolet-reactive resin, 4.0 parts by mass of CORONATE L (manufactured by Nippon Polyurethane Industry Co., Ltd.) as a curing agent, and 10 parts by mass of IRGACURE 184 (manufactured by BASF) as a photopolymerization initiator were blended with respect to 100 parts by mass of the (meth)acrylic copolymer to obtain a temporary-adhesive composition.

The obtained temporary-adhesive composition was coated on a transparent peeling liner so that a thickness of the temporary-adhesive layer was 30 μm. The formed temporary-adhesive layer was laminated on a corona-treated surface of the 100 μm-thick LDPE (low density polyethylene) film to obtain a 130 μm-thick ultraviolet-curable surface protective tape.

<Production of Semiconductor Chip>

The above-described ultraviolet-curable surface protective tape was laminated on the mask of the above-prepared wafer with a mask using a laminator DR8500III (trade name, manufactured by Nitto Seiki Co., Ltd.).

After that, the backing-face of the above-described wafer with a mask was ground using DGP8760 (trade name, manufactured by DISCO Corporation) until a thickness of the wafer got to 50 μm. The ground wafer with a mask was mounted on a dicing tape from the wafer backing-face side using RAD-2700F (trade name, manufactured by Lintec Corporation), and was supported and fixed to a ring flame. After that, an ultraviolet ray of 500 $mJ/cm^2$ was irradiated to the wafer from the surface protective tape side, and then the ultraviolet curable surface protective tape was peeled therefrom.

[Test Example 1] Peeling Property Evaluation of Surface Protective Tape

In the <Production of semiconductor chip> in each of the above-described Examples and Comparative Examples, a force (peeling property) required for peeling the surface protective tape was evaluated in accordance with the following criterion. The peeling of the surface protective tape was carried out using RAD-2700F (trade name, manufactured by Lintec Corporation).

—Criterion for Evaluation of Peeling Property of the Surface Protective Tape—

⊙: Only the surface protective tape could be simply peeled with a weak force.

○: A strongish force was required for peeling, but only the surface protective tape could be peeled.

x: The surface protective tape could not be peeled. Alternatively, the surface protective tape was peeled together with the mask material layer.

[Test Example 2] Removal Property Evaluation of the Mask Material Layer by $O_2$ Plasma Ashing In the <Production of semiconductor chip> in each of the above-described Examples and Comparative Examples, the presence or absence of a residual of the mask material after $O_2$ plasma ashing (ashing for 10 minutes at the etching rate of 1.5 μm/min) was checked using a laser microscope.

—Criterion for Removal Property Evaluation of the Mask Material Layer—

○: A residue of the mask material layer was non-existent.

x: A residue of the mask material layer was existent.

[Test Example 3] Evaluation of Adhesive Deposit on the Scribe Line

In the <Production of semiconductor chip> in each of the above-described Examples and Comparative Examples, a wafer surface after peeling of the surface protective tape was observed by a microscope to determine the presence or absence of an adhesive deposit on the scribe line.

—Evaluation Criteria of Adhesive Deposit on the Scribe Line—

○: An adhesive deposit was non-existent.

x: An adhesive deposit was existent.

The results of the Test Examples 1 to 3 are shown in the following table.

TABLE 1

|  | Ex 1 | Ex 2 | Ex 3 | CEx 1 | CEx 2 |
|---|---|---|---|---|---|
| Peeling property of surface protective tape | ⊙ | ○ | ⊙ | ○ | x |
| Removal property of mask material layer | ○ | ○ | ○ | x | x |
| Adhesive deposit on scribe line | ○ | ○ | ○ | x | ○ |

Remarks:
'Ex' means Example according to this invention, and
'CEx' means Comparative Example.

From the results of each of the above-described Test Examples, it was found that, by using the mask-integrated surface protective tape of the present invention in the production of the semiconductor chip with a processing of the semiconductor wafer, a mask can be simply formed without an adhesive deposit only by laminating the mask-integrated surface protective tape on a patterned surface of the semiconductor wafer and then peeling the surface protective tape from the mask-integrated surface protective tape, and further the mask can be removed with more certainty by an $O_2$ plasma, whereby occurrence of defective chips can be highly suppressed.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Semiconductor wafer
2 Patterned face
3 Mask-integrated surface protective tape
   3a Surface protective tape
      3aa Substrate film
      3ab Temporary-adhesive layer
   3b Mask material layer
4 Wafer fixing tape
   4a Temporary-adhesive layer or Adhesive layer
   4b Substrate film
7 Chip
S Surface
B Backing-face
M1 Wafer-grinding apparatus
M2 Pin
M3 Collet
F Ring flame
L Laser ($CO_2$ laser)
P1 Plasma of $SF_6$ gas
P2 Plasma of $O_2$ gas.

The invention claimed is:

1. A mask-integrated surface protective tape, comprising:
a substrate film;
a temporary-adhesive layer provided on the substrate film; and
a mask material layer provided on the temporary-adhesive layer;
wherein the mask material layer and the temporary-adhesive layer each comprise a (meth)acrylic copolymer,
wherein the temporary adhesive layer comprises a photopolymerization initiator, and
wherein an epoxy-based curing agent is used in the mask material layer, and an isocyanate-based curing agent is used in the temporary-adhesive layer,
wherein a glass transition temperature of the temporary adhesive layer is lower than a glass transition temperature of the mask material layer,
wherein a difference between the glass transition temperature of the (meth)acrylic copolymer which constitutes the temporary-adhesive layer and the glass transition temperature of the (meth)acrylic copolymer which constitutes the mask material layer is 10° C. or more,
wherein an amount of the epoxy-based curing agent used in the mask material layer is from 0.1 to 5.0 mass parts with respect to 100 mass parts of the (meth)acrylic copolymer, and
wherein the epoxy-based curing agent used in the mask material layer comprises 1,3-bis(N,N-diglycidyl aminomethyl)cyclohexane, 1,3-bis(N,N-diglycidylaminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate.

2. The mask-integrated surface protective tape according to claim 1, wherein the temporary-adhesive layer of the mask-integrated surface protective tape is radiation-curable.

3. The mask-integrated surface protective tape according to claim 2, wherein the (meth)acrylic copolymer which constitutes the temporary-adhesive layer has an ethylenically unsaturated bond at a side chain thereof.

4. The mask-integrated surface protective tape according to claim 3, wherein the (meth)acrylic copolymer of the temporary-adhesive layer comprises a (meth)acrylic acid alkyl ester, wherein the number of carbon atoms of an alcohol portion of the (meth)acrylic acid alkyl ester is from 8 to 12.

5. The mask-integrated surface protective tape according to claim 1, wherein the substrate film comprises a polyolefin resin layer.

6. The mask-integrated surface protective tape according to claim 1, wherein the mask material layer further comprises a fluorine-based release agent.

7. A mask-integrated surface protective tape, comprising:
a substrate film,
a temporary-adhesive layer provided on the substrate film, and
a mask material layer provided on the temporary-adhesive layer;
wherein the mask material layer and the temporary-adhesive layer each comprise a (meth)acrylic copolymer and a curing agent,
wherein an epoxy-based curing agent is used in the mask material layer, and an isocyanate-based curing agent is used in the temporary-adhesive layer, and
wherein an amount of the epoxy-based curing agent used in the mask material layer is from 0.1 to 5.0 mass parts with respect to 100 mass parts of the (meth)acrylic copolymer,
wherein a glass transition temperature of the temporary adhesive layer is lower than a glass transition temperature of the mask material layer,
wherein a difference between the glass transition temperature of the (meth)acrylic copolymer which constitutes the temporary-adhesive layer and the glass transition temperature of the (meth)acrylic copolymer which constitutes the mask material layer is 10° C. or more, and
wherein the epoxy-based curing agent used in the mask material layer comprises 1,3-bis(N,N-diglycidyl aminomethyl)cyclohexane, 1,3-bis(N,N-diglycidylaminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate.

8. The mask-integrated surface protective tape according to claim 7, wherein the temporary-adhesive layer of the mask-integrated surface protective tape is radiation-curable.

9. The mask-integrated surface protective tape according to claim 7, wherein the mask material layer further comprises a fluorine-based release agent.

10. The mask-integrated surface protective tape according to claim 7, which is used for a plasma dicing.

* * * * *